United States Patent [19]
Koschmeder et al.

[11] Patent Number: 6,109,930
[45] Date of Patent: Aug. 29, 2000

[54] ENHANCED HARDWARE ARRANGEMENT FOR MOUNTING A PLURALITY OF CIRCUIT BOARDS TOGETHER

[75] Inventors: Max J. Koschmeder, Oronoco; James L. Peacock, Rochester, both of Minn.

[73] Assignee: International Business Machines Corporation, Armonk, N.Y.

[21] Appl. No.: 09/149,144

[22] Filed: Sep. 8, 1998

[51] Int. Cl.[7] .................................................. H01R 12/00
[52] U.S. Cl. .............................................. 439/74; 439/331
[58] Field of Search ................................ 439/331, 67, 74, 439/66, 68, 372, 373

[56] References Cited

U.S. PATENT DOCUMENTS

| | | | |
|---|---|---|---|
| 4,538,865 | 9/1985 | Wakabayashi et al. | 439/66 |
| 4,948,374 | 8/1990 | Carter | 439/67 |
| 4,975,068 | 12/1990 | Squires | 439/67 |
| 5,009,608 | 4/1991 | Shipe | 439/331 |
| 5,123,849 | 6/1992 | Deak et al. | 439/66 |
| 5,213,511 | 5/1993 | Sobhani | 439/329 |
| 5,575,686 | 11/1996 | Noschese | 439/74 |
| 5,651,688 | 7/1997 | Lin | 439/331 |
| 5,707,241 | 1/1998 | Hamlin et al. | 439/67 |
| 5,919,055 | 7/1999 | Hattori | 439/372 |

*Primary Examiner*—Renee Luebke
*Assistant Examiner*—T. C. Patel
*Attorney, Agent, or Firm*—Robert H. Berdo, Jr.

[57] ABSTRACT

An enhanced electrical arrangement for a computer includes a first circuit board, and a second circuit board arranged essentially parallel to the first circuit board. A removable array connector is positionable between the first circuit board and the second circuit board. The array connector causes the first circuit board to be in electrical communication with the second circuit board. A clamping arrangement is provided for urging the first circuit board and the second circuit board toward each other, so as to exert a force against the array connector and cause an electrical connection between the first circuit board and the second circuit board. The clamping arrangement includes a back-up plate positionable adjacent to a major surface of the second circuit board, and an arm pivotally connected to the back-up plate. The arm is pivotable to a closed position so that the arm is located adjacent to a major surface of, and presses against, the first circuit board, to urge the first circuit board and the second circuit board toward each other and exert the force against the array connector. Further, the arm is pivotable to an opened position whereby the force is no longer exerted.

31 Claims, 5 Drawing Sheets

ENHANCED HARDWARE ARRANGEMENT FOR MOUNTING A PLURALITY OF CIRCUIT BOARDS TOGETHER

BACKGROUND OF THE INVENTION

1. Field of the Invention

The invention relates to an enhanced hardware arrangement for mounting a plurality of circuit boards together, and in particular, to an enhanced arrangement for mounting an array connector, a processor card and a backplane together.

2. Background Information

Backplanes are wiring boards, which are a type of circuit board used in computers, and are typically connected to various other circuit boards, such as a processor card and a so-called memory riser card. Further, it is typical to attach a clock card, which is a further type of circuit board, to the backplane. This assembly of the backplane and various circuit boards may then be positioned within an open cage, which is a frame fixed within, for example, a computer housing. The cage serves to position the circuit boards within the computer housing.

During operation, the various electrical components located on the circuit boards, for example the processor modules attached to the processor card, tend to consume a substantial amount of electrical power, and therefore tend to generate a substantial amount of heat. Because excess temperature can impair a computer system's reliability and functionality, the processor cards are provided with heat sinks in a region of their respective processor modules, to help dissipate the generated heat. On some processor cards, the heat sinks are provided in such a high density that nearly the entire surface of the card is covered by heat sinks. For example, the processor card may be provided with two or more processor modules soldered to a surface of the card, with each module containing, for example, two processor chips. Each of these chips would typically be connected to its own respective heat sink, which is conventionally positioned over its corresponding chip. Further, the processor card may also be provided with one or more memory modules, each of which likewise will typically be provided with a respective heat sink.

Typically, circuit boards are electrically connected to the backplane in a permanent relationship by soldering the circuit boards directly to the backplane. This type of connection disadvantageously prevents the circuit board from being easily removed from the backplane for repair or replacement purposes. Alternatively, the circuit boards can be connected to the backplane using a pin-and-socket connector. However, this type of connection disadvantageously requires a substantial amount of space in order to accommodate the necessary connectors, and results in a relatively high impedance between the circuit boards and the backplane. As is known to those skilled in the art, a high impedance is undesirable, since this may attenuate the signal strength between the backplane in the associated circuit board.

It is also known to use an array connector in order to electrically connect a circuit board to a backplane. Such connectors are typically composed of a relatively small, flat panel having a relatively large number of conductive pads formed thereon. For example, an array connector may have a rectangular profile, and be about three centimeters in height by six centimeters in length. An array of conductors, for example silver pins, are provided. Each conductor extends entirely through the panel to project slightly beyond both of the panel's opposing surfaces. The conductors are arranged in an array, for example, of twenty-five rows, by forty-one columns (i.e., 1025 conductors).

The array connector is positioned between the backplane and the associated circuit board, with the conductors engaging with, and providing an electrical connection between, respective wirings located on the backplane and the circuit board. In order to ensure an electrical connection between the circuit board and the backplane, it is necessary that each conductor of the array connector be pressed against the associated respective wirings. Thus, a relatively large force, for example, 180 pounds of force, is typically applied in such a manner that the array connector is held under pressure between the circuit board and the backplane. Typically, this force is generated through the use of a relatively large, expensive, complicated arrangement of springs and screws which are positioned at each of the four corners on the array connector. However, since space is often limited, this type of arrangement may not be suitable for many computer applications. For example, since processor cards are typically provided with a plurality of heat sinks, as described above, the location of the heat sinks may interfere with the above-described arrangement of springs and screws, thus prohibiting the use of an array connector with certain processor cards. Thus, there is a need for a connector that it is suitable for securely holding an array connector between two circuit boards, such as a backplane and a processor card, using a minimum amount of space.

Additionally, the known arrangement for securing an array connector to circuit boards is difficult to use, due to its complexity. Further, access to the springs and screws of the known arrangement may be limited. Therefore, there is a need for an arrangement for securing an array connector between two circuit boards, such as a backplane and a processor card, that is easy to use.

Furthermore, the conductors of the array connector will typically compress due to the applied force over a period of time. This will result in a gradual reduction in the applied force, which may ultimately result in the electrical connection between the backplane and the circuit board failing. Thus, there is a need for a way to apply the necessary force to an array connector which will not diminish over a period of time.

SUMMARY OF THE INVENTION

It is, therefore, a principle object of this invention to provide an enhanced hardware arrangement for mounting a plurality of circuit boards together.

It is another object of the invention to provide an enhanced hardware arrangement for mounting a plurality of circuit boards together that solves the above mentioned problems.

These and other objects of the present invention are accomplished by the enhanced hardware arrangement for mounting a plurality of circuit boards together disclosed herein.

According to an exemplary embodiment of the present invention, a clamping arrangement is used to clamp an array connector between a first member and a second member, such as a backplane and a processor card. In this disclosure, reference to the backplane and the processor card is being used by way of example only. However, the present invention can be used whenever a compact, reliable clamping arrangement is needed.

The array connector has a plurality of conductive members. Each conductive member is in electrical communication with both the backplane and the processor card, when the clamping arrangement is in place and engaged.

Preferably, the clamping arrangement is adapted so that the positioning of heat sinks on the processor card will not interfere with the operation of the clamping arrangement. This allows the clamping arrangement to be utilized even when heat sinks are densely arranged on a surface of the processor card.

According to an exemplary embodiment of the present invention, the clamping arrangement includes a pivotally-mounted arm. The arm is pivotable to a closed position so that the arm exerts a force against the processor card, to urge the processor card toward the backplane. The arm is further pivotable to an opened position whereby the force is no longer exerted against the processor card. This exemplary arrangement advantageously holds the processor card and the backplane together, in a simple and compact, yet secure manner. Further, this arrangement is easy to use, requiring no special skills of a user, or any special tools to implement.

Preferably, the arm will be freely pivoted to the opened and closed positions between adjacent heat sinks located on the processor card. This allows the arm to be positioned to exert the force against the processor card, even with a processor card having heat sinks disposed in a densely-arranged pattern.

Advantageously, the arm has a projecting region located between a first end of the arm and a second end of the arm. The projecting region projects toward the processor card when the arm is in the closed position, and allows the force to be exerted where needed, and in a localized manner.

Preferably, the projecting region does not increase a cross-sectional profile of the arm. This advantageously allows for uniform bending along a length of the arm.

Since the conductive members of the array connector will permanently compress over time when the arm is in the closed position, the arm is advantageously configured to flex when retained in the closed position so as to maintain the force at an essentially constant level over time. This ensures that a predetermined force will always be exerted against the array connector. As a result, a reliable electrical connection between the backplane and the processor card can be ensured.

Preferably, the clamping arrangement further includes a back-up plate positionable adjacent to a major surface of the backplane. One end of the arm is pivotally connected to the back-up plate. When the arm is in the closed position, the arm is positioned adjacent to a major surface of the processor card. This causes the backplane and the processor card to be retained between the arm and the back-up plate. This arrangement advantageously securely clamps the backplane and the processor card between the back-up plate and the arm, using a minimal number of components. Moreover, this arrangement is self-supporting, and allows a sufficient force to be generated, without relying on the backplane and/or the processor card for support.

According to a further exemplary embodiment of the invention, the clamping arrangement includes an assembly for retaining the arm in the closed position. The assembly can include a post attached to the back-up plate and being threaded to receive a fastener, and a threaded fastener contacting the arm, and being engageable with the threads of the post when the arm is in the closed position. This arrangement allows the clamping arrangement to be maintained in the closed position so that the backplane and the processor card are held together as long as needed. Further, this assembly allows the arm to be readily released, so that it may be pivoted to the opened position, as needed.

The clamping arrangement may also include a pressure distribution plate that is positionable between the arm and the processor card. The projecting region engages with the pressure distribution plate when the arm is in the closed position, which helps to distribute the force from the arm over a desired area. Further, the pressure distribution plate prevents distortion of, for example, the array connector, and minimizes stress against the components of the computer, such as the backplane, array connector and processor card.

Moreover, the pressure distribution plate may be positioned in a space separating the major surface of the processor card from the associated heat sinks. This will allow the pressure distribution plate to be utilized without interfering with a placement of the heat sinks, and still allow the arm to engage with the pressure distribution plate when the arm is in the closed position.

The clamping arrangement may further include a first insulator plate positionable between the pressure distribution plate and the processor card, and a second insulator plate positionable between the back-up plate and the backplane. The insulator plates advantageously allow the pressure distribution plate and the back-up plate to be formed of a metal, such as steel, while electrically isolating the pressure distribution plate, the arm and back-up plate from the backplane and processor card.

Advantageously, the back-up plate will include a plurality of guide pins projecting away from a surface thereof. The first insulator plate, the second insulator plate, and the pressure distribution plate may then have holes formed therethrough an in registration with the respective guide pins. The guide pins are insertable through the respective holes to align the back-up plate, the first insulator plate, the second insulator plate, and the pressure distribution plate relative to one another. This will advantageously allow all the components of the clamping arrangement to be properly aligned in an easy yet cost effective manner.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Figure 1:
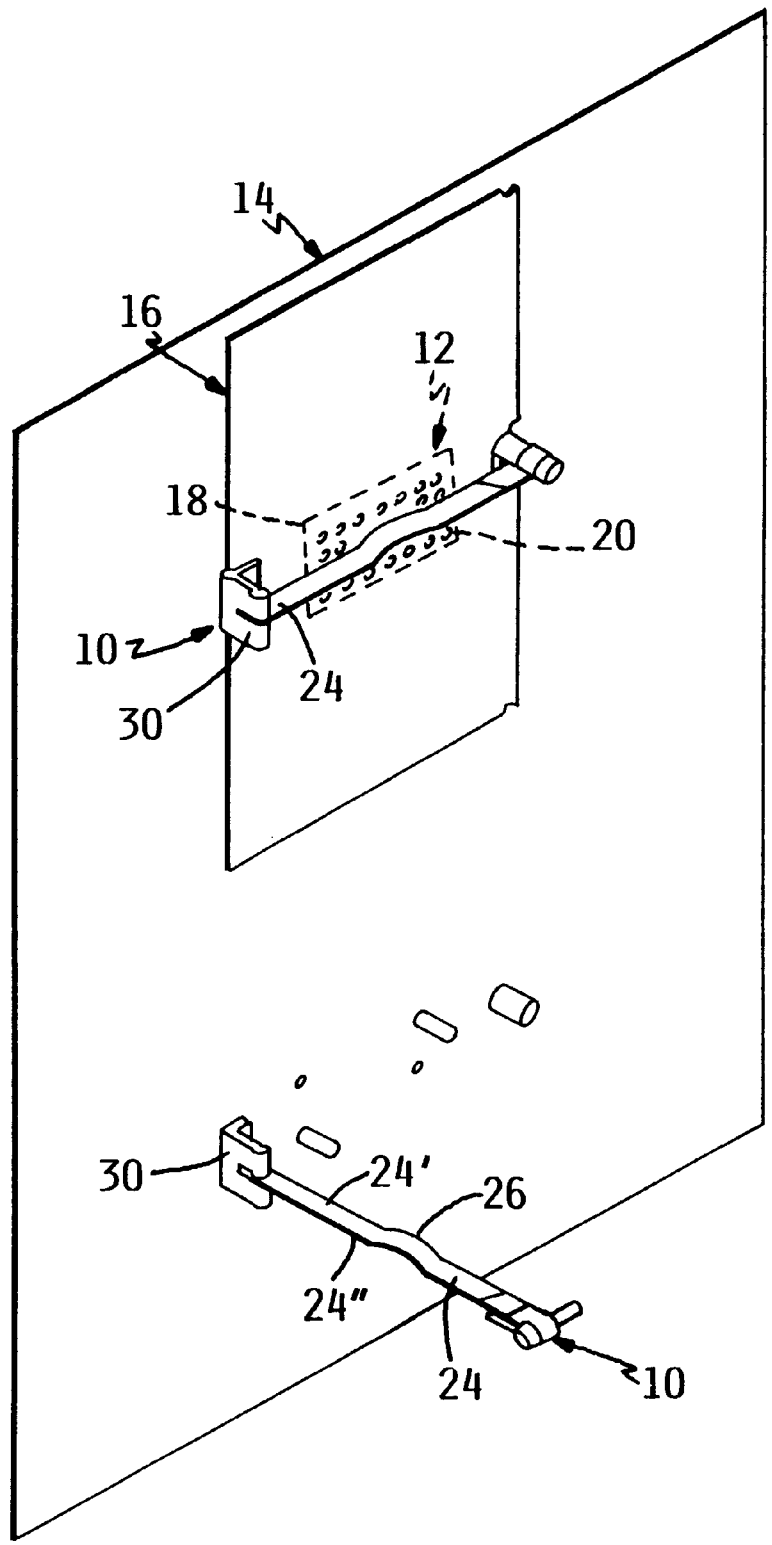
FIG. 1 is a perspective illustration of a clamping arrangement, according to an exemplary embodiment of the invention, being used to clamp two circuit boards together.

FIG. 1 illustrates an exemplary embodiment of the invention being utilized to electrically interconnect various circuit boards used within a computer system. For example, in this exemplary embodiment, the invention is a clamping arrangement 10 used to clamp an array connector 12 between two circuit boards, such as backplane 14 and a processor card 16. However, the present invention can also be used whenever a reliable clamping arrangement 10 is needed that utilized a minimum amount of space, provides a relatively large clamping force, and/or is easy to use.

As shown in FIG. 1, the processor card 16 and the backplane 14 are located in essentially parallel planes, and are separated from one another by a space. The array connector 12 is located within the space, and in a plane that is essentially parallel to the processor card 16 and backplane 14.

Figure 2:
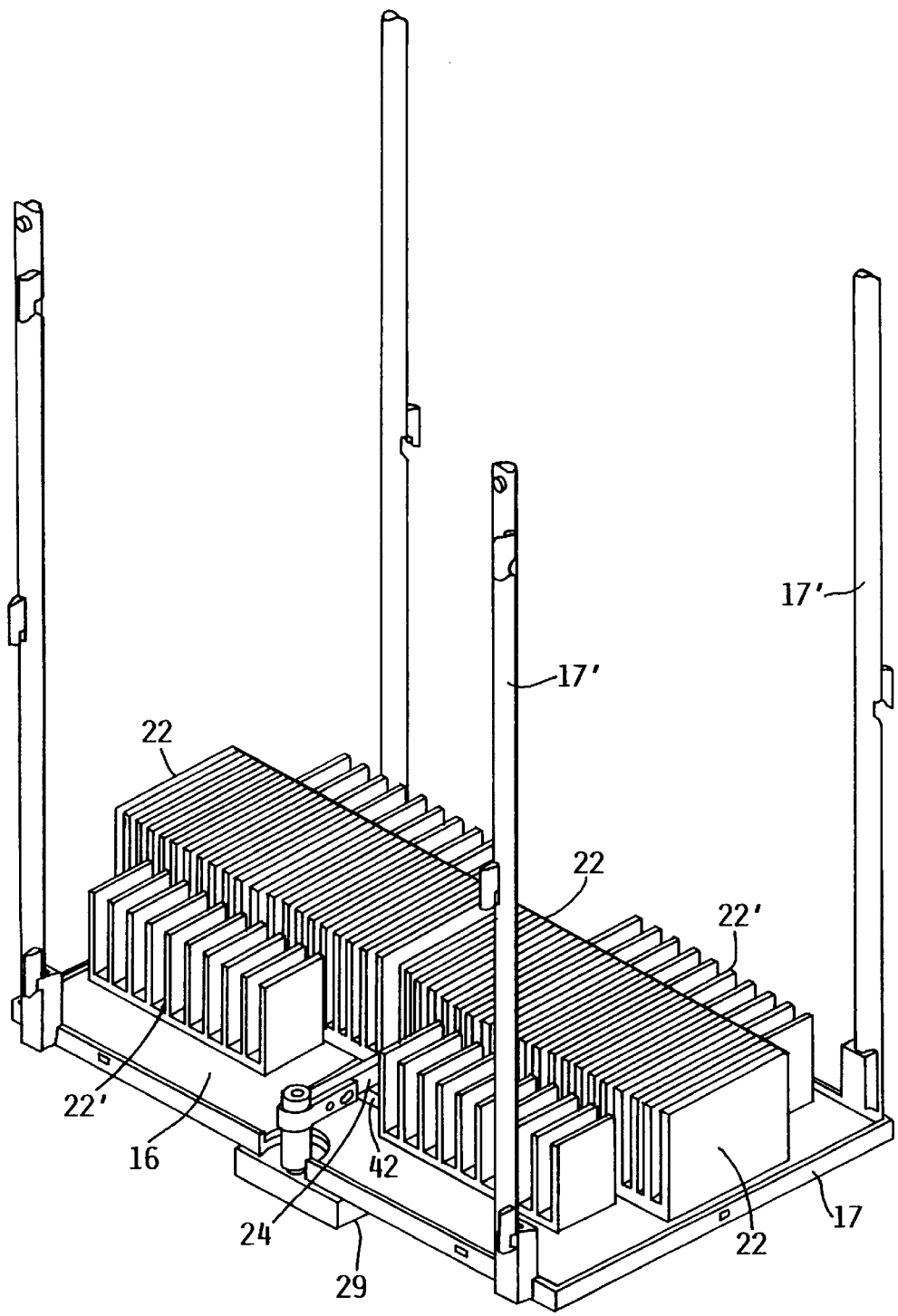
FIG. 2 is a perspective view of the clamping arrangement shown in FIG. 1, in which features of an associated exemplary circuit board are shown.

Additionally, and referring also to FIG. 2, the processor card 16 can be received within a frame 17 that is adapted to slide along guide rails 17' that are fixed within a computer in a predetermined location. This allows the processor card 16 to be easily aligned with the backplane 14 simply by sliding the frame 17 and the processor card 16 along the rails 17', until the processor card 16, array connector 12 and backplane 14 engage with one another.

The array connector 12 includes a plate 18, which is typically comprised of a nonconductive material, such as plastic. Although the plate 18 is illustrated in the exemplary embodiment as being generally flat, with a rectangular configuration, the plate 18 is not limited to this shape. Instead, as used within this specification, the term "plate" connotes any member having either a flat and/or curved surface, with any type of profile.

The array connector 12 further includes a plurality of conductive members 20, for example, 1025 conductive members. Of course, the present invention is not limited for use with an array connector 12 having only this specific number of conductive members 20. The conductive members 20 are arranged in an array, and extend through the plate 18 to project out from both major surfaces thereof. Further, the conductive members 18 of the array connector 12 will preferably be formed from a soft, conductive material, such as an elastomeric material impregnated with particles, of silver.

The processor card 16 and the backplane 14 will typically be specifically tailored so as to allow for their interconnection using the array connector 12. For example, both the processor card 16 and the backplane 14 may be provided with a plurality of conductive pads (not shown, and referred to as lands) arranged in an array pattern similar to that formed on the array connector 12. When the lands of the backplane 14 are connected with the lands of the processor card 16, the backplane 14 and the processor card 16 will then be in electrical communication with one another so as to allow the passing of electrical signals and/or power. The array connector 12, when properly positioned between the backplane 14 and the processor card 16, and in registration with the lands, will allow such communication between the backplane 14 and the processor card 16 through its conductive members 20.

In order to ensure the array connector 12 will make this necessary electrical connection between the backplane 14 and the processor card 16, a substantial force is applied against the array connector 12, for example, a minimum of a 180 pounds of force. This will cause the conductive members 20 of the array connector 12 to make a positive contact with the respective lands of the backplane 14 and the processor card 16. However, when the force is applied against the array connector 12, the conductive members 20 will tend to compress over a period of time.

Further, and as shown in FIG. 2, the processor card 16 has a relatively large number of heat sinks 22, 22' located on its major surface. For example, in an exemplary embodiment of the present invention, the processor card 16 is provided with two processor modules (not shown), each of which contains two processor chips. Each of these chips is connected to its own respective heat sink 22. These heat sinks 22 tend to be relatively large, so that the heat sinks associated only with the respective processor chips tend to cover nearly a third of the surface of the processor card 16. Other free portions of the surface of the processor card 16 have further heat sinks 22' provided thereon, which are connected with respective memory modules, or other components. In the illustrated embodiment, the processor card 16 has eight heat sinks 22, 22' thereon arranged in a relatively dense pattern (i.e., four heat sinks 22 arranged end-to-end, and two heat sinks 22' arranged on both sides of the heat sinks 22).

Preferably, the processor modules are located underneath respective ones of the heat sinks 22, so that the base of the heat sink is separated from a surface of the processor card 16 by a thickness of the respective processor modules. Since the so called foot-print of the heat sinks 22 is substantially larger than the foot-print of the corresponding processor module, there is a space available between the base of the heat sinks and the surface of the processor card 16 that can be utilized to accommodate various components of the invention, as will be subsequently explained. Moreover, each heat sink 22, 22' is preferably separated from adjacent heat sinks by a space, thus facilitating air flow around the respective heat sinks. As will be subsequently explained, the spaces between adjacent heat sinks can likewise be used to accommodate components of the clamping arrangement 10 according to present invention. Thus, the clamping arrangement 10 can advantageously be used even when the heat sinks 22, 22' are densely arranged on the surface of the processor card 16.

According to an exemplary embodiment of the present invention, the clamping arrangement 10 includes a pivotally-mounted arm 24. The arm 24 having two opposing major surfaces 24', which are separated from one another by a distance that defines a thickness of the arm. The arm 24 further has two opposing minor surfaces 24", which are separated from each other by a distance that that defines a width of the arm. The width is greater than the thickness is pivotable in a plane that is essentially parallel to the major surfaces 24' to a closed position (i.e., the position shown with the top clamping arrangement 10 shown in FIG. 1) so that the arm 24 exerts a force against the processor card 16, to urge the processor card 16 toward the backplane 14, for example. However, the clamping arrangement 10 can also be configured so that the arm 24 exerts a force against the backplane 14, without departing from the spirit or scope of the invention. The arm 24 is further pivotable to an opened position (i.e., the position shown with the lower clamping arrangement 10 of FIG. 1) whereby the force is no longer exerted against the processor card 16. This exemplary arrangement advantageously holds the backplane 14 and the processor card 16 together, in a simple and compact, yet secure manner. Further, this arrangement is easy to use, requiring no special skills of a user, or any special tools to implement.

The arm 24 has generally an elongated shape, terminated by a first end and a second end. Further, the surfaces 24' and 24" define an outer periphery of the arm, with the outer periphery defining a rectangular cross-sectional profile of the arm. A projecting region 26 is located between the first and second ends. In the exemplary illustrated embodiment, the projecting region 26 is a bend in the arm 24, which advantageously allows the arm to have an essentially constant cross-sectional profile, allowing for a uniform bending along a length of the arm. However, the projecting region 26 can also be formed by attaching or forming a projecting part to an otherwise essentially straight arm. When pivoted into the closed position, the arm 24 will be located adjacent to the processor card 16, with the projecting region 26 projecting toward the processor card 16. The projecting region 26 advantageously allows the force to be exerted where needed, and in a localized manner.

As shown in FIG. 2, when in the closed position, the arm 24 is located between adjacent heat sinks 22 located on the processor card 16, which are separated from one another by a small space. When pivoted into a raised or opened position, the arm 24 is moved out of the space separating the heat sinks 22. This allows the clamping arrangement 10 to be used even with processor cards 16 having heat sinks disposed in a densely-arranged pattern.

Since the conductive members of the array connector 12 will permanently compress over time when the arm 24 is in the closed position, the arm 24 is advantageously formed of a material, such as stainless steel, that will allow the arm 24 to flex when retained in the closed position, without permanently deforming the arm. This flexing will allow the arm 24 to maintain the force at an essentially constant level over an extended period of time. This ensures that the required force, for example, 180 pounds, will always be exerted against the array connector 12. As a result, a reliable electrical connection between the backplane 14 and the processor card 16 can be ensured.

Figure 3:
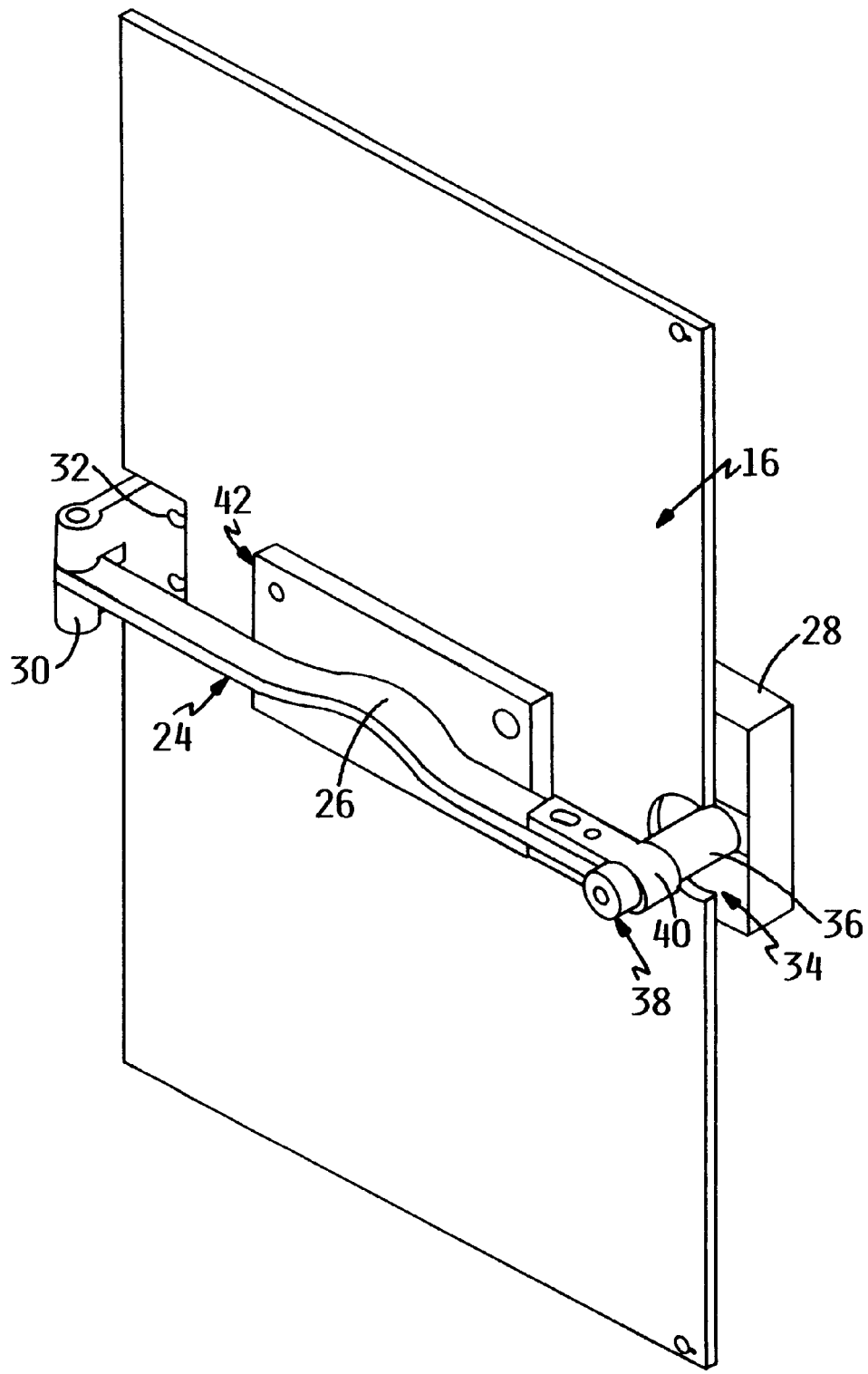
FIG. 3 is a further perspective view of the clamping arrangement shown in FIG. 1.
Figure 4:
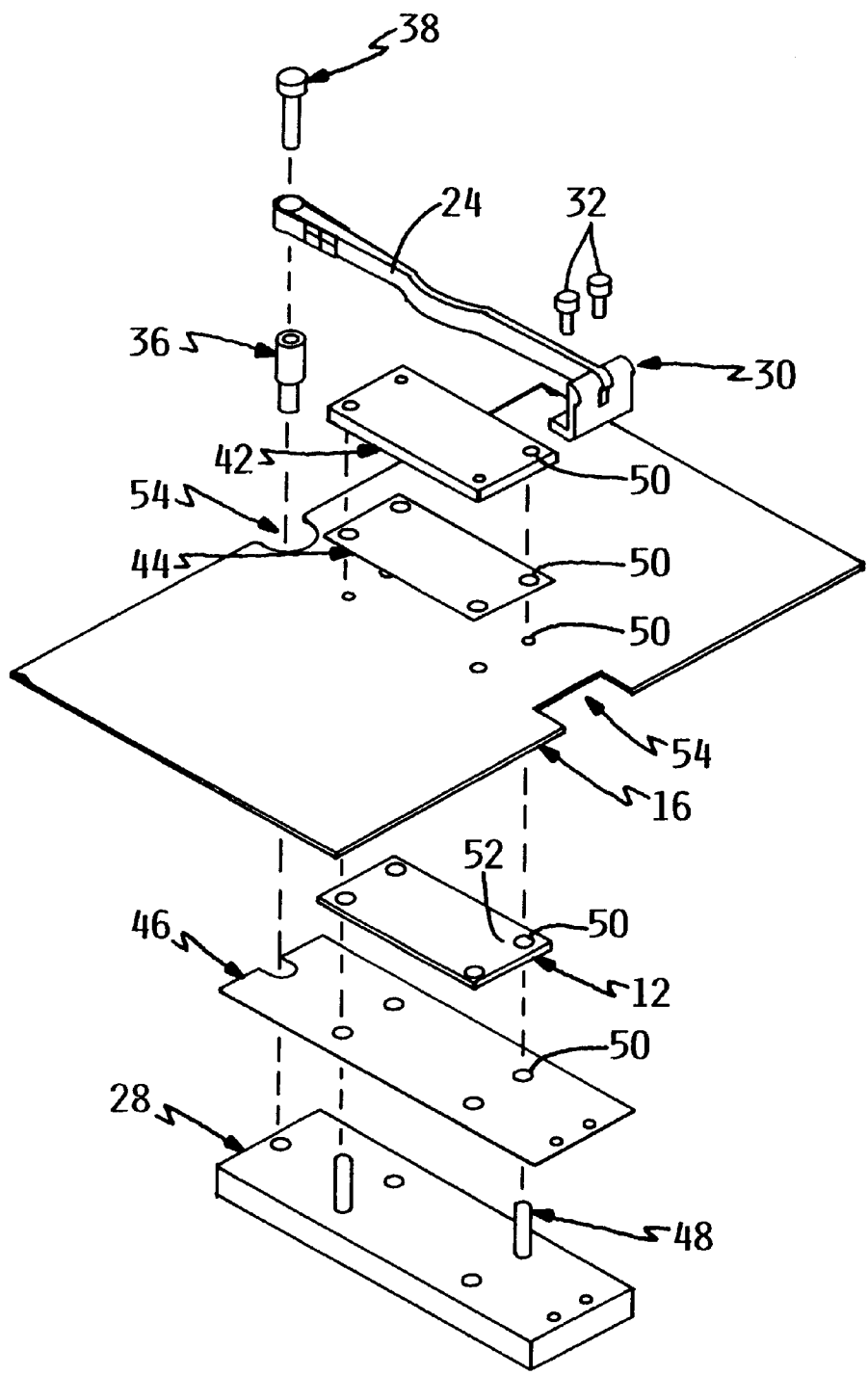
FIG. 4 is an exploded perspective view of the clamping arrangement shown in FIG. 1.
Figure 5:
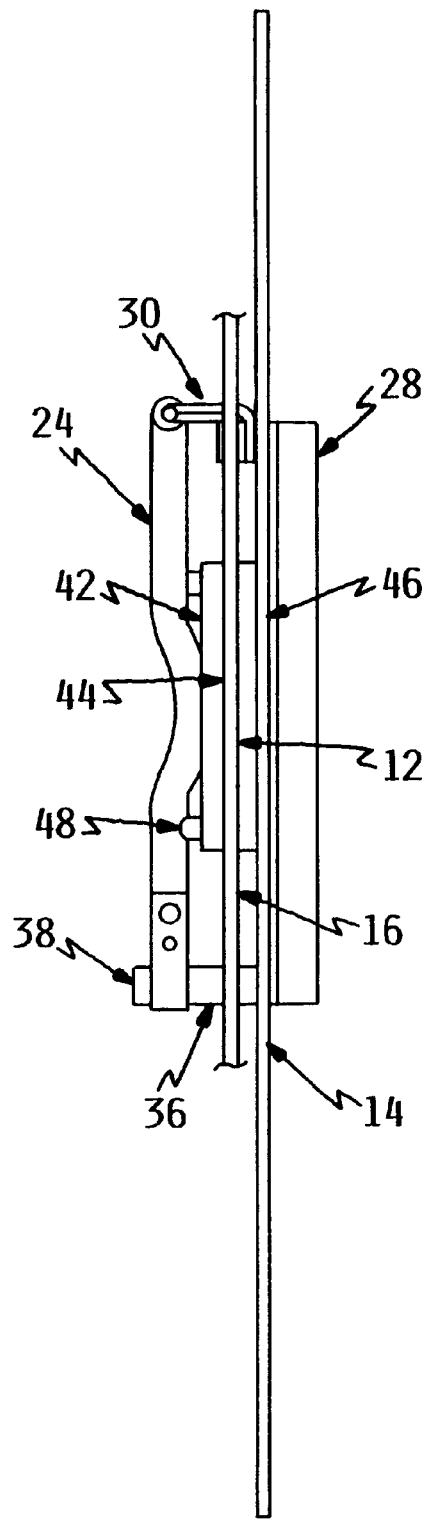
FIG. 5 is a side view of the clamping arrangement shown in FIG. 1.

Referring also to FIGS. 3–5, the clamping arrangement 10 further includes a back-up plate 28 positionable adjacent to a major surface of the backplane 14 (in FIGS. 2–4 the backplane 14 has not been shown, in order to facilitate the illustration of the back-up plate 28). The back-up plate 28 may be comprised of any rigid material having a sufficiently high strength; however, in this exemplary embodiment, the back-up plate 28 is comprised of steel.

Preferably, one end of the arm 24 is pivotally connected to the back-up plate 28, using, for example, a hinge post 30. The hinge post 30 can be fastened or fastenable to the back-up plate 28, and have the arm 24 pivotally mounted thereto. For example, the hinge post 30 can be an integral component of the back-up plate 28, or a separate component that may be fastened to the back-up plate 28 using, for example, screws 32. Further, in the exemplary illustrated embodiment, the hinge post 30 is an L-shaped plate, with one leg of the plate being fastened to the back-up plate 28 using screws 32, and with the other, free leg arranged to extend in a direction perpendicular to a surface of the back-up plate 28, and toward the arm 24. The free end is notched to receive the arm 24. As shown, the end of the arm 24 is received within the notch, and pivotally connected to the hinge post 30.

Since the arm 24 is positioned adjacent to a major surface of the processor card 16 when the arm 24 is in the closed position, this arrangement advantageously causes the backplane 14 and the processor card 16 to be retained between the arm 24 and the back-up plate 28, using a minimum number of components. Moreover, this arrangement is self-supporting, and allows a sufficient force to be generated, without relying on the backplane 14 and/or the processor card 16 for support.

According to an exemplary embodiment of the present invention, the clamping arrangement 10 includes an assembly 34 for retaining the arm 24 in the closed position. For example, the assembly can include a threaded post 36 attached to the back-up plate 28, projecting in a direction toward the arm 24, and parallel to the free leg of the hinge post 30. A threaded fastener, for example, a threaded pressure screw 38, can be provided that contacts the arm 24, and that is engageable with the threads of the post 36 when the arm 24 is in the closed position.

Further, the end of the arm 24 can be provided with a looped collar 40 to allow the threaded pressure screw 38, for example, to pass therethrough, with the head of the threaded pressure screw resting against the collar 40. The arm 24 can be maintained in the closed position by engaging the threaded pressure screw 38 with the threads of the post 36.

Advantageously, the threading of the pressure screw 38 into the post 36 will cause the collar 40 attached to the end of the arm 24 to seat against the top of the post 36. At this stage, a predetermined force, such as 180 pounds of force, will be exerted by the arm 24 against the processor card 16.

Alternatively, the back-up plate 28 can be provided with an internally threaded hole (not shown) which is adapted to receive the pressure screw 38. Yet a further alternative would be to provide the post 36 with an externally threaded shaft (not shown) that would project through the collar 40 when the arm 24 is in the closed position. A threaded not (not shown) could then engage with the threaded shaft to hold the arm 24 in the closed position. Other arrangements of holding the arm 24 in the closed position are also within the scope of the present invention. This assembly allows the clamping arrangement 10 to be maintained in the closed position so that the backplane 14 and the processor card 16 are held together as long as needed. Further, this assembly allows the arm 24 to be easily released, so that it may be pivoted to the opened position, as needed.

The clamping arrangement 10 may also include a pressure distribution plate 42 that is positionable between the arm 24 and the processor card 16. The pressure distribution plate 42 may be comprised of any rigid material; however, in this exemplary embodiment, the pressure distribution plate 42 is comprised of steel. The pressure distribution plate 42 is used to help distribute the applied clamping force from the arm 24 to the underlying array connector 12, and is tailored to have essentially the same profile as the array connector 12.

Preferably, the projecting region 26 of the arm 24 engages with the pressure distribution plate 42 when the arm 24 is in the closed position. By using the pressure distribution plate 42, a concentrated force can be applied from the projecting region 26, and distributed over a desired area. Further, the pressure distribution plate 42 prevents distortion of, for example, the array connector 12, and minimizes stress against the components of the computer, such as the backplane 14, array connector 12 and processor card 16.

Moreover, as best shown in FIG. 2, the pressure distribution plate 42 may be positioned in the space separating the major surface of the processor card 16 from the base of the heat sinks 22 disposed thereon. This will allow the pressure distribution plate 42 to be located without interfering with a placement of the heat sinks 22, and still allow the arm 24 to engage with the pressure distribution plate 42 when the arm 24 is in the closed position.

If either the back-up plate 28 or the pressure distribution plate 42 is comprised of a conductive material, it may necessary to electrically isolate them from the respective surfaces of the backplane 14 or processor card 16. In order to accomplish this, and according to a further exemplary embodiment of the present invention best shown in FIGS. 4 and 5, the clamping arrangement 10 may include a first insulator plate 44 which is positionable between the surface of the processor card 16 having the heat sinks 22, 22' located thereon, and the pressure distribution plate 42.

Preferably, the first insulator plate 44 is positioned adjacent to a surface of the pressure distribution plate 42, so that the first insulator plate 44 is located between the processor card 16, and the pressure distribution plate 42 and arm 24. Additionally, although the first insulator plate 44 is shown by way of example as having a generally rectangular shape, the first insulator plate 44 is not limited to such a shape. However, it is preferred that the first insulator plate 44 be configured to have essentially the same profile as the pressure distribution plate 42. Thus, the first insulator plate 44 will essentially cover the entire surface of the pressure distribution plate 42, so as prevent the pressure distribution plate 42 from inadvertently coming into electrical contact with any circuitry located on the processor card 16.

The first insulator plate 44 may be located in the space provided between the heat sinks 22 and the surface of the processor card 16. In such an exemplary embodiment, both the pressure distribution plate 42 and the first insulator plate 44 will have a total thickness that it is no more than the distance separating the base of the heat sinks 22 from the surface of the processor card 16.

The clamping arrangement 10 may also include a second insulator plate. Preferably, the second insulator plate 46 is positioned adjacent to a surface of the back-up plate 28, so that the second insulator plate 46 is located between the back-up plate 28 and the backplane 14. Additionally, although the second insulator plate 46 is shown by way of example as having a generally rectangular shape, the second insulator plate 46 is not limited to such a shape. However, it is preferred that the second insulator plate 46 be configured to have essentially the same profile as the back-up plate 28. Thus, the second insulator plate 46 will essentially cover the entire surface of the back-up plate 28, so as prevent the back-up plate 28 from inadvertently coming into electrical contact with any circuitry located on the backplane 14.

The insulator plates 44, 46 advantageously allow the back-up plate 28 and/or the pressure distribution plate 42 to be formed of a relatively strong, rigid metal, without shorting out the circuitry located on the respective circuit boards. Of course, if either the back-up plate 28 or the pressure distribution plate 42 is formed of a non-conductive material, such as plastic, then the respective insulator plates 44, 46 may not be needed.

In order to maintain the various components of the connector assembly in the correct relative position, the back-up plate 28 can be provided with one or more guide pins 48 which project from its surface toward the pressure distribution plate 42. The guide pins 48 could pass through corresponding through holes 50 located within the second insulator plate 46, the backplane 14, the array connector 12, the processor card 16, the first insulator plate 44 and the pressure distribution plate 42, so as allow all the components of the clamping arrangement 10 to be properly aligned in an easy yet cost effective manner. Moreover, this arrangement advantageously properly aligns the conductors of the array connector 12 with the corresponding lands located on the backplane 14 and the processor card 16.

Further, the array connector 12 can be provided with further guide pins 52 which project out from the surface of the array connector 12 plate, and which engage with corresponding holes (not shown) formed in the backplane 14 and the processor card 16. These further guide pins 52 can be used to pre-align the array connector 12 to the backplane 14 and the processor card 16.

If necessary, the backplane 14 and/or the processor card 16 can be provided with cut-outs 54 to allow for the passage of various components of the clamping arrangement 10. For example, FIG. 4 illustrates two cut-outs formed in opposing edges of the processor card 16, which allow for the passage of the threaded post 36 and the L-shaped hinge post 30. The backplane 14 may be provided with similar cut-outs or holes, if necessary.

During the assembly, and as previously discussed, the pressure distribution plate 42, and if necessary, the first insulator plate 44, are positioned beneath the heat sinks 22 located on the processor card 16. For example, the first insulator plate 44 and the pressure distribution plate 42 may be slid beneath the already attached heat sinks 22 into the correct position. Alternatively, the first insulator plate 44 and the pressure distribution plate 42 may be positioned on the surface of the processor card 16 prior to connecting the heat sinks 22 to their corresponding modules. In this second scenario, it may not be possible to remove the first insulator plate 44 and the pressure distribution plate 42 from the processor card 16 without first removing the heat sinks 22. However, in both situations, the pressure distribution plate 42 (and the first insulator plate 44, if used) is located in the space provided between the base of the heat sinks 22 and the surface of the processor card 16, and in registration with the array connector 12.

Thereafter, with the arm 24 pre-attached to the back-up plate 28 and in the opened position, the guide pins 48 of the back-up plate 28 are inserted through the corresponding holes 50 located in the second insulator plate 46, backplane 14, array connector 12, processor card 16, first insulator plate 44 and the pressure distribution plate 42, respectively. This will properly position the array connector 12 relative to the lands of the backplane 14 and processor card 16, and will locate the various components of the clamping arrangement 10 in their proper positions. The arm 24 can then be moved to the closed position, i.e., pivoted between the corresponding heat sinks 22 located on the processor card 16.

In order to secure the arm 24 in the closed position and to exert the necessary force against the array connector 12, the pressure screw 38 (or other fastening device, such as a threaded nut) is engaged with the post 36 and tightened, which will pull the arm 24 in a direction toward the back-up plate 28. This will cause the projecting region 26 on the arm 24 to engage with the pressure distribution plate 42. The pressure distribution plate 42 will cause the force to be evenly distributed across the surface of the array connector 12 so as to ensure an electrical connection is made between the various conductors on the array connector 12 and the corresponding lands on the backplane 14 and the processor module.

Advantageously, the threading of the pressure screw 38 into the post 36 will cause the collar 40 attached to the end of the arm 24 to seat against the top of the post 36. At this stage, the arm 24 will be flexed, and a predetermined force, such as 180 pounds of force, will be exerted by the arm 24 against the pressure distribution plate 42.

It should be understood, however, that the invention is not necessarily limited to the specific arrangement and components shown and described above, but may be susceptible to numerous variations within the scope of the invention.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes, and adaptations, and the same are intended to be comprehended within the meaning and range of equivalents of the appended claims.

What is claimed is:

1. A clamping arrangement, comprising:
   a first circuit board;
   a second circuit board;
   at least two heat sinks disposed on a major surface of said first circuit board;
   a rigid pressure distribution plate positionable over the major surface of said first circuit board and beneath said at least two heat sinks;
   an arm having two opposing major surfaces separated from one another by a distance that defines a thickness of said arm, and two opposing minor surfaces separated from each other by a distance that defines a width of said arm, the width being greater than the thickness, said arm being pivotable in a plane that is essentially parallel to said two opposing major surfaces to a closed position so that the arm exerts a force against the first circuit board via said pressure distribution plate to urge the first circuit board toward the second circuit board, and being pivotable in the plane to an opened position whereby the force is no longer exerted against the first circuit board, wherein when said arm is pivoted to said closed position, said arm moves between said at least two heat sinks without directly contacting said heat sinks, said arm further including a projecting region that projects toward and engages with said pressure distribution plate to exert the force against the first circuit board when said arm is in the closed position, whereby said pressure distribution plate equally distributes the force against the first circuit board; and
   a back-up plate having an end of said arm pivotally connected thereto, and being positionable adjacent to a major surface of the second circuit board, said arm being positionable adjacent to the major surface of the first circuit board when in the closed position so that the first circuit board and the second circuit board are retained between said arm and said back-up plate.

2. The clamping arrangement of claim 1, further comprising means for retaining said arm in the closed position.

3. The clamping arrangement of claim 2, wherein said means for retaining comprises:
   a post attached to said back-up plate and being threaded to receive a fastener; and
   a threaded fastener contacting said arm, and being engageable with the threads of said post when said arm is in the closed position.

4. The clamping arrangement of claim 3, wherein said arm has a first end and a second end, said first end being the end of said arm that is pivotally connected to said back-up plate, said second end being adopted to receive said threaded fastener.

5. The clamping arrangement of claim 4, wherein said arm has a constant cross-sectional profile along essentially its entire length.

6. The clamping arrangement of claim 4, wherein said arm has a collar at said second end, said threaded fastener being received within said collar.

7. The clamping arrangement of claim 3, wherein said post has an internal thread, and said threaded fastener comprises a pressure screw.

8. The clamping arrangement of claim 1, further comprising a first insulator plate positionable between said arm and the first circuit board, and a second insulator plate positionable between said back-up plate and the second circuit board.

9. The clamping arrangement of claim 1, wherein one of the first circuit board and the second circuit board comprises a backplane.

10. The clamping arrangement of claim 1, wherein said two opposing major surfaces and said two opposing minor surfaces define an outer periphery of said arm.

11. The clamping arrangement of claim 10, wherein the outer periphery of said arm defines a rectangular cross-sectional profile of said arm.

12. The clamping arrangement of claim 11, wherein said projecting region comprises a bend in said arm, and wherein the bend has the rectangular cross-sectional profile.

13. The clamping arrangement of claim 12, wherein said arm has the rectangular cross-sectional profile along essentially its entire length.

14. The clamping arrangement of claim 1, wherein said arm flexes when in the closed position, the flexing of the arm maintaining the force at an essentially constant level when said arm is in the closed position.

15. The clamping arrangement of claim 1, wherein said pressure distribution plate comprises a steel plate.

16. A clamping arrangement, comprising:
   an arm pivotable to a closed position so that the arm exerts a force against a first member to urge the first member toward a second member, and being pivotable to an opened position whereby the force is no longer exerted against the first member;
   a back-up plate having an end of said arm pivotally connected thereto, and being positionable adjacent to a major surface of the second member, said arm being positionable adjacent to a major surface of the first member when in the closed position so that the first member and the second member are retained between said arm and said back-up plate, wherein said arm has a first end and a second end, the first end being the end of said arm that is pivotally connected to said back-up plate, said arm further having a collar at said second end, and a projecting region located between the first end and the second end that projects toward said back-up plate when said arm is in the closed position;
   a pressure distribution plate positionable between said arm and the first member, said projecting region engaging with said pressure distribution plate when said arm is in the closed position;
   a first insulator plate positionable between said pressure distribution plate and the first member, and a second insulator plate positionable between said back-up plate and the second member; and
   means for retaining said arm in the closed position, said means comprising:
      a post attached to said back-up plate and being threaded to receive a fastener; and
      a threaded fastener contacting said collar, said threaded fastener being engageable with said post when said arm is in the closed position.

17. The clamping arrangement of claim 16, wherein said back-up plate includes a plurality of guide pins projecting away from a surface thereof, and wherein said first insulator plate, said second insulator plate, and said pressure distribution have holes formed therethrough and in registration with said guide pins, said guide pins being insertable through the respective holes to align said back-up plate, said first insulator plate, said second insulator plate, and said pressure distribution plate relative to one another.

18. The clamping arrangement of claim 17, further comprising an L-shaped hinge post having a first leg fastened to said back-up plate, and having a second leg with the first end of said arm pivotally fastened thereto.

19. An enhanced electrical arrangement for a computer, comprising:

a first circuit board;

a second circuit board arranged essentially parallel to said first circuit board;

a removable array connector positionable between said first circuit board and said second circuit board, said array connector causing said first circuit board to be in electrical communication with said second circuit board; and clamping means for urging said first circuit board and said second circuit board toward each other, so as to exert a force against said array connector and cause an electrical connection between said first circuit board and said second circuit board, said clamping means comprising:

a back-up plate positionable adjacent to a major surface of said second circuit board; and an arm pivotally connected to said back-up plate, and being pivotable to a closed position so that said arm is located adjacent to a major surface of, and presses against, said first circuit board, to urge said first circuit board and said second circuit board toward each other and exert the force against said array connector, said arm being pivotable to an opened position whereby the force is no longer exerted.

20. The electrical arrangement of claim 19, wherein said first circuit board comprises a processor card having a plurality of heat sinks connected to the major surface thereof, said arm being freely pivotal to the opened and closed positions between adjacent heat sinks, and said second circuit board comprises a backplane.

21. The electrical arrangement of claim 20, wherein each of said heat sinks is positioned away from the major surface of said processor card by a space; said clamping means further comprising:

a pressure distribution plate positioned in the space separating the major surface of said processor card from said heat sinks, said arm engaging with said pressure distribution plate when said arm is in the closed position.

22. The electrical arrangement of claim 20, wherein said array connector includes:

a plate having two major surfaces and being formed of an insulating material, and a plurality of conductive members disposed in an array formation, each of said conductive members extending through said plate and projecting from both major surfaces of said plate so as to electrically communicate said backplane with said processor card when said arm is in the closed position.

23. The electrical arrangement of claim 22, wherein said arm has a first end and a second end, the first end being pivotally connected to said back-up plate, said arm having a collar at the second end, said arm further having a projecting region located between the first end and the second end that projects toward said processor card when said arm is in the closed position, said clamping means further comprising:

a pressure distribution plate positionable between said arm and said processor card, said projecting region engaging with said pressure distribution plate when said arm is in the closed position;

a first insulator plate positionable between said pressure distribution plate and said processor card, and a second insulator plate positionable between said back-up plate and said backplane; and means for retaining said arm in the closed position, said means comprising:

a post attached to said back-up plate and being threaded to receive a fastener, and a threaded fastener contacting said collar, said threaded fastener being engageable with said post when said arm is in the closed position.

24. The electrical arrangement of claim 23, wherein said conductive members of said array connector permanently compress over a period of time when said arm is in the closed position; and wherein said arm flexes when retained in the closed position so as to maintain the force at an essentially constant level over the period of time.

25. A method of clamping two circuit boards together, comprising:

positioning a back-up plate adjacent to a first major surface of a first circuit board;

positioning a second circuit board adjacent to a second major surface of the first circuit board, in a superposed relationship, the second circuit board having at least two adjacent heat sinks disposed on an exposed major surface thereof;

positioning a rigid pressure distribution plate between the second circuit board and an arm connected to the back-up plate, and beneath the at least two heat sinks;

pivoting the arm into a position that places the arm between the at least two heat sinks, essentially parallel to the back-up plate, and adjacent to and in contact with the pressure distribution plate, wherein said pivoting moves the arm between the two adjacent heat sinks without directly contacting the heat sinks; and maintaining the arm in the position, so as to hold the first circuit board and the second circuit board in the superposed relationship and to exert a force against the first circuit board and the second circuit board, said maintaining including pressing the arm against the pressure distribution plate so as to distribute the force exerted against the first circuit board and the second circuit board.

26. The method of clamping as recited in claim 25, wherein said maintaining the arm includes fastening the arm in the position, so as to exert the force against the first circuit board and the second circuit board.

27. The method of clamping as recited in claim 26, wherein said fastening includes controlling an amount of the force being exerted against the first circuit board and the second circuit board.

28. A method of clamping two circuit boards together, comprising:

positioning a back-up plate adjacent to a first major surface of a first circuit board;

positioning a second circuit board adjacent to a second major surface of the first circuit board, in a superposed relationship;

positioning an electrical connector between the first circuit board and the second circuit board;

positioning a pressure distribution plate between the second circuit board and an arm pivotally connected to the back-up plate;

pivoting the arm into a position that places the arm essentially parallel to the back-up plate, and adjacent to an exposed major surface of the second circuit board; and maintaining the arm in the position, so as to hold the first circuit board and the second circuit board in the superposed relationship, said maintaining the arm including:

fastening the arm in the position, so as to exert a force against the first circuit board and the second circuit board, said fastening including:

controlling an amount of the force being exerted against the first circuit board and the second circuit board;

pressing the arm against the pressure distribution plate so as to distribute the force exerted against the first circuit board and the second circuit board; and urging the first circuit board and the second circuit board against respective opposing surfaces of the electrical connector to electrically couple the first circuit board to the second circuit board.

29. The method of clamping as recited in claim 28, wherein said fastening includes exerting at least about 180 pounds of force.

30. The method of clamping as recited in claim 28, wherein said fastening causes conductors of the electrical connector to compress over a period of time; further comprising automatically maintaining the force to be essentially constant over the period of time.

31. A computer, comprising:

a computer housing;

a backplane disposed within said computer housing;

a processor card arranged essentially parallel to said backplane, and having a plurality of heat sinks connected to, and positioned away from, a major surface of said processor card;

a removable array connector positionable between said backplane and said processor card, and including:

a plate having two major surfaces and being composed of an insulating material; and a plurality of conductive members disposed in an array formation, each of said conductive members extending through said plate and projecting from both major surfaces of said plate so as to electrically communicate said backplane with said processor card; and clamping means for urging said backplane and said processor card toward each other, so as to exert a constant, essentially non-diminishing force against said array connector and cause an electrical connection between said backplane and said processor card, said clamping means comprising:

a back-up plate positionable adjacent to a major surface of said backplane;

an arm having a first end pivotally connected to said back-up plate, and being pivotable to a closed position so that said arm is between respective ones of said heat sinks and adjacent to the major surface of, and presses against, said processor card, to urge said backplane and said processor card toward each other and exert the force against said array connector, said arm being pivotable to an opened position whereby the force is no longer exerted, said arm further having a collar at a second end thereof, and a projecting region located between said first end and said second end that projects toward said processor card when said arm is in the closed position;

a pressure distribution plate positionable in a space separating the major surface of said processor card from said heat sinks, said projecting region of said arm engaging with said pressure distribution plate when said arm is in the closed position;

a first insulator plate positionable between said pressure distribution plate and said processor card, and a second insulator plate positionable between said back-up plate and said backplane; and means for retaining said arm in the closed position, comprising:

a post attached to said back-up plate and being threaded to receive a fastener; and a threaded fastener received within said collar, said threaded fastener being engageable with said post when said arm is in the closed position.

* * * * *